United States Patent [19]

Hawrylo

[11] Patent Number: 4,523,212

[45] Date of Patent: Jun. 11, 1985

[54] SIMULTANEOUS DOPED LAYERS FOR SEMICONDUCTOR DEVICES

[75] Inventor: Frank Z. Hawrylo, Trenton, N.J.

[73] Assignee: The United States of America as represented by the Secretary of the Air Force, Washington, D.C.

[21] Appl. No.: 357,441

[22] Filed: Mar. 12, 1982

[51] Int. Cl.³ .................. H01L 33/00; H01L 27/14; H01L 29/167; H01L 23/48
[52] U.S. Cl. .................................. 357/17; 357/30; 357/63; 357/67; 372/44; 372/45
[58] Field of Search .................. 357/17, 30, 67, 63; 372/44, 45

[56] References Cited

U.S. PATENT DOCUMENTS

| | | | |
|---|---|---|---|
| 2,979,428 | 4/1961 | Jenny et al. | 357/63 |
| 3,465,159 | 9/1969 | Stern | 357/17 |
| 3,573,114 | 3/1971 | Marinace | 357/63 |
| 3,602,777 | 8/1971 | Berman | 317/234 R |
| 3,684,930 | 8/1972 | Collins et al. | 317/234 R |
| 3,914,785 | 10/1975 | Ketchow | 357/17 |
| 4,024,569 | 5/1977 | Hawrylo et al. | 357/63 |
| 4,105,955 | 8/1978 | Hayashi et al. | 357/45 |
| 4,131,904 | 12/1973 | Ladany et al. | 356/17 |
| 4,195,308 | 3/1980 | Hawrylo | 357/67 |
| 4,323,911 | 4/1982 | Campbell et al. | 357/30 |
| 4,340,966 | 7/1982 | Akiba et al. | 357/17 |
| 4,355,396 | 10/1982 | Hawrylo et al. | 357/17 |
| 4,366,568 | 12/1982 | Shimuzu et al. | 357/17 |

FOREIGN PATENT DOCUMENTS 2109360  9/1971  Fed. Rep. of Germany ........ 357/17

OTHER PUBLICATIONS

Nelson et al., "Effect in 0.88µ" *Appl. Phys. Lttr.*, vol. 4, No. 11, Jun. 1, 1964, pp. 192-194.

Dousmanis et al., "Effect in Diodes" *Appl. Phys. Lt.*, vol. 3, No. 8, Oct. 15, 1963, pp. 133-135.

Brown, Effective Distribution Coeff. of Some Group VI Elements in Indium Phosphide Grown by LPE, Solid State Electronics, 1974, 505 to 507.

Williams, Indium Phosphide, Journal of Electrochemical Society, 1973, 1741-1749.

Yim, Solid Solution in the Pseudobinary (III-V)-(II-VI) Systems and Their Optical Energy Cups, Journal of Applied Physics, 1969, pp. 2617-2623.

*Primary Examiner*—Martin H. Edlow
*Assistant Examiner*—Jerome Jackson, Jr.
*Attorney, Agent, or Firm*—Donald J. Singer; Stanton E. Collier

[57] ABSTRACT

An indium phosphide semiconductor layer or layers are simultaneously doped with groups II-VI elements such as zinc and selenium. These simultaneously (acceptor/donor) doped layers offer improved characteristics when used as an ohmic contact capping layer of indium phosphide or as the active laser region in long wavelength light emitting diodes composed of indium phosphide. The simultaneous doping is achieved through the use of liquid phase epitaxy.

2 Claims, 1 Drawing Figure

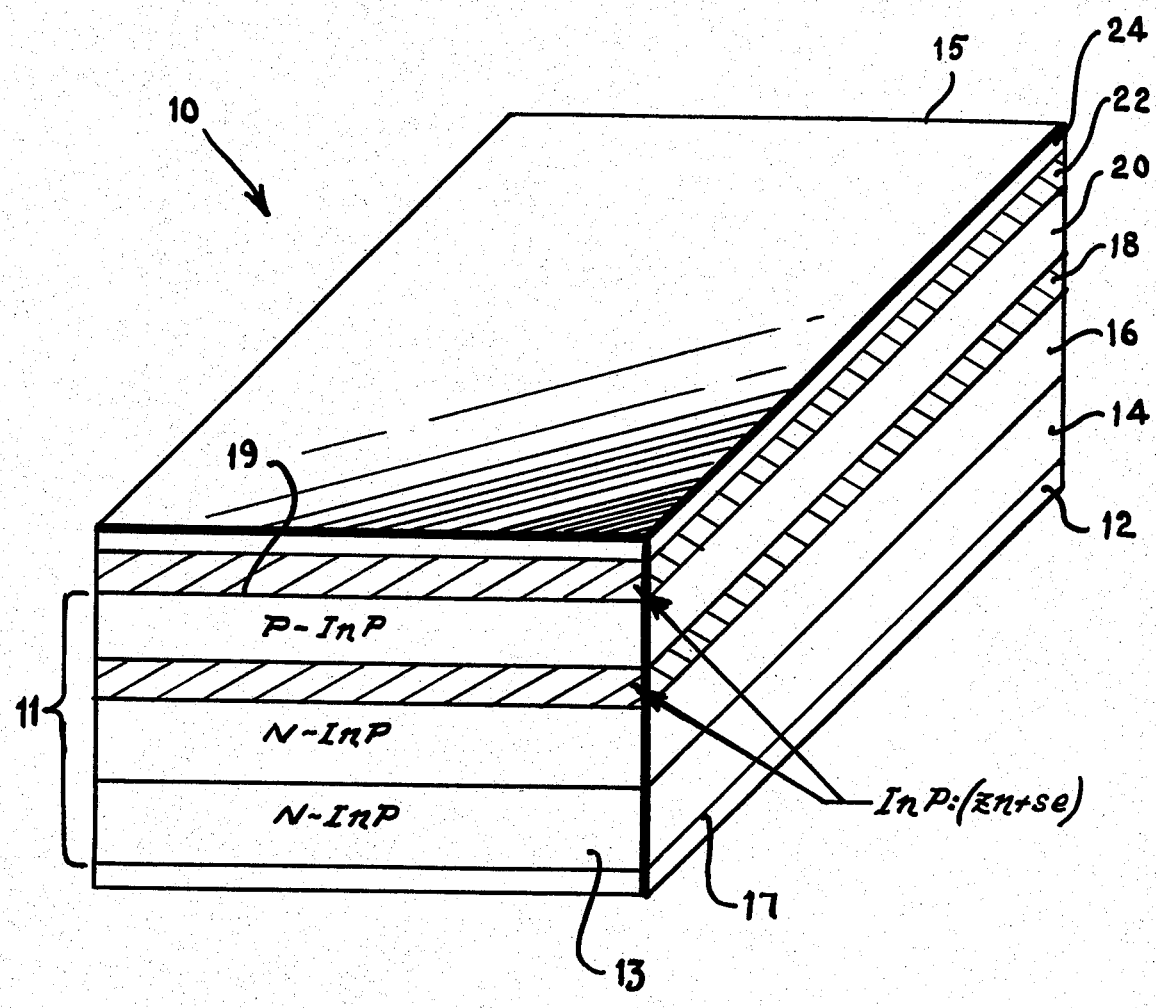

SIMULTANEOUS DOPED LAYERS FOR SEMICONDUCTOR DEVICES

STATEMENT OF GOVERNMENT INTEREST

The invention described herein may be manufactured and used by or for the Government for governmental purposes without the payment of any royalty thereon.

BACKGROUND OF THE INVENTION

The present invention relates to semiconductor devices, and, more particularly, to semiconductor materials for the layers therein. The purposes of particular layers can be directed towards such goals as improved ohmic contact between these devices and external circuits, improved electroluminescent, or devices having improved reliability.

Electroluminescent devices, for example, are usually constructed of layers of single crystalline semiconductor materials. When biased, these devices emit electromagnetic energy through the process of recombination of oppositely charged carriers. Typical devices are light emitting diodes and lasers having a dual heterojunction.

Because these devices are made of layers of different semiconductor materials, problems arise naturally in the fabrication of these materials into different layers, such as lattice mismatch between the layers, and different thermal coefficients of expansion. Another problem in manufacturing semiconductor devices lies in attaching metal electrical leads to the semiconductor material. Metal to semiconductor contacts, commonly called ohmic contacts, must not add significant resistance to the structure and should not alter the equilibrium carrier densities within the semiconductor so as to change the characteristics of the device. Some metal to semiconductor contacts may form rectifying barriers which render them unacceptable for use in this area. Often, a highly doped or degenerate semiconductor region is employed to act as an interface between the metal and semiconductor material. This region is doped so that the two resulting contacts, a metal-semiconductor and a semiconductor-semiconductor contact, have relatively linear resistivity and other desirable properties.

Satisfactory ohmic contacts are particularly difficult to form on P type semiconductor material having an energy bandgap in excess of 1.6 electron volts (ev). Under these circumstances, the degenerate semiconductor region usually has a narrow energy bandgap than the adjacent semiconductor material thus providing a better surface to which the metal contact layer can be applied. However, this creates additional problems with respect to the matching of the crystal lattices of the wide energy bandgap material to the degenerate region. If the lattices of the two semiconductor regions differ substantially, stresses will occur at the interface between the two regions. These stresses may result in a loss of efficiency in the semiconductor and may even cause the semiconductor material to crack at the semiconductor interface thereby physically damaging the device.

In particular, when InGaAsP is used as the degenerate semiconductor layer for ohmic contact or is used as the active layer for a laser device, lattice mismatch between InGaAsP and, for example, InP causes at times the InGaAsP layer to physically shear-off during mounting or to separate from the underlying structure during device operation. Further, carryover of expitaxial solutions onto the surface of the InGaAsP layer on growth completion lessens the amount of useable material for device fabrication.

Minimizing lattice mismatch between the different layers, selecting layers with similar thermal coefficients of expansion, and minimizing fabrication problems would clearly lead to improved electroluminescent devices.

SUMMARY OF THE INVENTION

The present invention is an indium phosphide layer having a group II acceptor dopant and a group VI donor dopant in combination with other layers having desired properties. The group II dopant may be zinc, and the group VI dopant can be selenium. This layer is used as an ohmic capping layer on a P type indium phosphide layer or as a laser cavity layer between N type and P type indium phosphide layers. In the method of fabricating this indium phosphide layer doped with zinc and selenium, the zinc and selenium are preferably simultaneously introduced into the indium phosphide layer by the liquid phase epitaxy technique.

BRIEF DESCRIPTION OF THE DRAWING

The only FIGURE of the drawing shows a semiconductor device employing the present invention.

DETAILED DESCRIPTION OF THE INVENTION

The present invention is described using a semiconductor laser 10. The semiconductor laser 10 includes therein the invention used both as an ohmic capping layer and as a laser cavity layer. With reference to the only FIGURE of the drawing, semiconductor laser 10 has the shape of a right parallelepiped solid 11 and is formed of a single crystalline semiconductor material. Solid 11 has two end sides 13 and 15, and first and second surfaces 17 and 19, substantially parallel to one another.

Solid 11 includes a highly doped N type substrate 14. Substrate 14 is composed of groups III–V elements such as indium phosphide. A first epitaxial layer or layers 16 is also doped to be of N type conductivity and is formed on substrate 14. A second epitaxial layer 18 is simultaneously doped with two elements from the groups II–VI to form a P type conductivity material. Second epitaxial layer 18 is of a material having a narrower energy bandgap width than the material of first epitaxial layer 16 and forms the recombination region of laser 10. A third epitaxial layer or layers 20 is of P type conductivity and is formed on second epitaxial layer 18. Solid 11 is thus composed of substrate 14, first, second, and third epitaxial layers 16, 18 and 20 in that respective order. The epitaxial layers 16, 18, 20 and substrate 14 are composed of indium phosphide doped with appropriate elements. In particular, second epitaxial layer 18 is doped with zinc, and selenium or sulfur.

Emission wavelengths of 1.02 micrometers for indium phosphide doped with zinc and selenium and 1.01 micrometers for indium phosphide doped with zinc and sulfur have been verified by photoluminescence measurements. Second epitaxial layer 18 can thus be used in a dual heterojunction laser and in a light emitting diode structure. These devices can be coupled to optical fibers for communication purposes.

The energy bandgap of indium phosphide doped with zinc and selenium is measured as 1.209 ev. The lattice space of indium phosphide is 5.8693 angstroms (Å) and the lattice space is 5.8657 when InP is doped with zinc and selenium. The resulting mismatch is +0.063%. The improvements resulting from the use of second epitaxial layer 18 are as follows: (1) the growth of the layer is simplified since only two dopants are used and the growth occurs upon a similar semiconductor material; (2) the amount of lattice mismatch is decreased since indium phosphide is the same base material for first, second, and third epitaxial layers 16, 18 and 20; and (3) the thermal coefficients of expansion are substantially the same between layers 16, 18 and 20.

An additional aspect of this invention is the degenerate ohmic capping layer 22. Body 11 includes a first and second electrical contact 12 and 24, respectively. Layer 22 provides improved ohmic contact between third epitaxial layer 20 of P type indium phosphide and second electrical contact layer 24. First electrical contact layer 12 is formed on substrate 14. Capping layers 22 is composed of identical elements as second epitaxial layer 18 in substantially equal weight percentages. The energy bandgap of capping layer 22 is equal to 1.209 ev and is less than the bandgap of third layer 20. The crystal lattice parameter of third layer 20 and capping layer 22 is substantially equal and is disclosed hereinabove with respect to first and second layers 16 and 18.

Indium phosphide of capping layer 22 is doped with an acceptor of either zinc or cadmium and with a donor such as selenium or sulfur. Capping layer 22 should have a higher conductivity than third layer 20. Second electrical contact layer 24 is formed on one surface of capping layer 22 in a manner so as to form a good ohmic contact.

Laser body 11 and capping layer 22 may be grown by liquid phase epitaxy similar to that described in U.S. Pat. No. 3,565,702 issued on Feb. 23, 1970, to H. Nelson. When using this technique, second layer 18 is grown in a refractory furnace boat having a typical growth solution containing a charge of 5 grams of indium, 41.7 milligrams of indium phosphide, 1.2 milligrams of zinc, and 9.1 milligrams of selenium. The charges to make capping layer 22 are substantially equal to those noted above. The growth temperature range is from about 632° centigrade to 635° centigrade. The temperature dropping from 635° C. to 632° C. at a rate of 0.34 degrees centigrade per minute. The resulting second layer 18 is 4.8 micrometers thick.

The forming of substrate 14, first layer 16, third layer 20, and electrical contacts 12 and 24 is conventional. Substrate 14, first, second, and third layers 16, 18 and 20, and capping layer 22 are made of indium phosphide doped with appropriate N type and/or P type elements as noted hereinabove.

The improved ohmic contact which is formed on the P type surface of third layer 20 has several advantages over the previous contacts. Capping layer 22 has a higher conductivity and a narrower energy bandgap thus providing a surface to which good metal-to-semiconductor contact can be made. Further, since capping layer 22 and third layer 20 are of the same semiconductor material, although doped differently, the crystal lattice parameters are substantially equal, 5.8693 Å to 5,8657 Å. This factor reduces strain at the interface of capping layer 22 and third layer 20 thus reducing the possibility of cracking or separating of the materials. Also, because of the similar materials, fabrication problems are greatly reduced.

Obviously, many modifications and variations of the present invention are possible in light of the above teachings and it is therefore understood that, within the scope of the disclosed inventive concept, the invention may be practiced otherwise than specifically described.

What is claimed is:

1. A semiconductor device comprising:
    a solid having a plurality of semiconductor layers and a substrate, said semiconductor layers being formed upon said substrate, said layers being composed of indium phosphide;
    at least one ohmic capping layer formed on an outer surface of said solid, said capping layer comprised of indium phosphide, and both a group II element, and a group VI element, said capping layer being formed of material comprising indium phosphide, zinc, and selenium having been formed from a growth solution in amounts of about 99.6199% indium, 0.1762% phosphorous, 0.1801% selenium and 0.0238% zinc by weight;
    a first electrical contact on said capping layer for connecting said semiconductor device into a circuit; and
    a second electrical contact formed on said substrate for connecting said device into a circuit.

2. An electroluminescent semiconductor device comprising:
    a first electrical contact;
    an indium phosphide substrate having said first electrical contact on a first contact surface thereof;
    at least one N-type indium phosphide layer, said N-type layer formed on said substrate opposite to said first contact surface;
    an active laser region composed of indium phosphide and doped P-type formed on said N-type layer, said active laser region having a bandgap less than said N-type layer upon which formed;
    at least one P-type indium phosphide layer, one surface of said P-type layer operably formed on said active laser region;
    an ohmic capping layer of indium phosphide operably formed on said P-type layer, said capping layer being P-type; and
    a second electrical contact formed on said ohmic capping layer so that electrical current can flow through said device, wherein said active laser region and said ohmic capping layer are doped simultaneously with a group II element and a group IV element; said laser region and said capping layer comprising indium phosphide, zinc, and selenium, said laser region and said capping layer having been formed from a growth solution having amounts of about 99.6199% indium, 0.1762% phosphorous, 0.1801% selenium, and 0.0238% zinc by percent weight.

* * * * *